US011757457B2

(12) United States Patent
Osawa

(10) Patent No.: US 11,757,457 B2
(45) Date of Patent: Sep. 12, 2023

(54) PHASE SYNCHRONIZATION CIRCUIT, TRANSMISSION AND RECEPTION CIRCUIT, AND SEMICONDUCTOR INTEGRATED CIRCUIT

(71) Applicant: Socionext Inc., Kanagawa (JP)

(72) Inventor: Hiromitsu Osawa, Kanagawa (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 17/877,481

(22) Filed: Jul. 29, 2022

(65) Prior Publication Data
US 2022/0368334 A1 Nov. 17, 2022

Related U.S. Application Data

(63) Continuation of application No. PCT/JP2020/006858, filed on Feb. 20, 2020.

(51) Int. Cl.
*H03L 7/099* (2006.01)
*H03K 3/023* (2006.01)
(Continued)

(52) U.S. Cl.
CPC ........... *H03L 7/0995* (2013.01); *H03K 3/023* (2013.01); *H03L 7/093* (2013.01); *H03L 7/18* (2013.01); *H03L 2207/06* (2013.01)

(58) Field of Classification Search
CPC ..... H03L 7/0995; H03L 7/099; H03L 7/0996; H03L 7/0997; H03L 7/0998
See application file for complete search history.

(56) References Cited

U.S. PATENT DOCUMENTS 6,552,618 B2 * 4/2003 Nelson .................... H03L 7/099
331/34
7,786,771 B2 8/2010 Tsai et al.
(Continued)

FOREIGN PATENT DOCUMENTS

JP 2000-216675 A 8/2000
JP 2008-124687 A 5/2008
(Continued)

OTHER PUBLICATIONS

International Search Report (ISR) dated Apr. 14, 2020 issued in International Patent Application No. PCT/JP2020/006858, with English translation.

*Primary Examiner* — Diana J. Cheng
(74) *Attorney, Agent, or Firm* — McDermott Will & Emery LLP

(57) ABSTRACT

A phase synchronization circuit includes: an oscillation circuit that includes a variable current generation unit that generates a variable current of a current amount corresponding to a control voltage and a fixed current generation unit that generates a fixed current of a current amount corresponding to a correction code and generates an output clock signal having a frequency corresponding to the total current amount of the variable current and the fixed current; a feedback circuit that generates a feedback clock signal based on the output clock signal; a control voltage generation circuit that generates the control voltage to make a frequency of the output clock signal become a desired frequency in a normal operation mode; and a correction code generation circuit that generates the correction code in a calibration mode, in which in the calibration mode, the control voltage generation circuit outputs a fixed one of the control voltage.

18 Claims, 9 Drawing Sheets

(51) Int. Cl.
*H03L 7/093* (2006.01)
*H03L 7/18* (2006.01)

(56) References Cited

U.S. PATENT DOCUMENTS

| | | | |
|---|---|---|---|
| 8,816,782 B2 * | 8/2014 | Chang | H03L 7/0995 |
| | | | 331/108 R |
| 9,647,609 B2 * | 5/2017 | Lee | H03L 7/0895 |
| 2002/0140504 A1 | 10/2002 | Hasegawa | |
| 2012/0223780 A1 | 9/2012 | Urakawa | |

FOREIGN PATENT DOCUMENTS

| | | |
|---|---|---|
| JP | 2010-239483 A | 10/2010 |
| JP | 2010-273386 A | 12/2010 |
| JP | 2012-034212 A | 2/2012 |
| JP | 2012-191275 A | 10/2012 |

* cited by examiner

F I G. 1
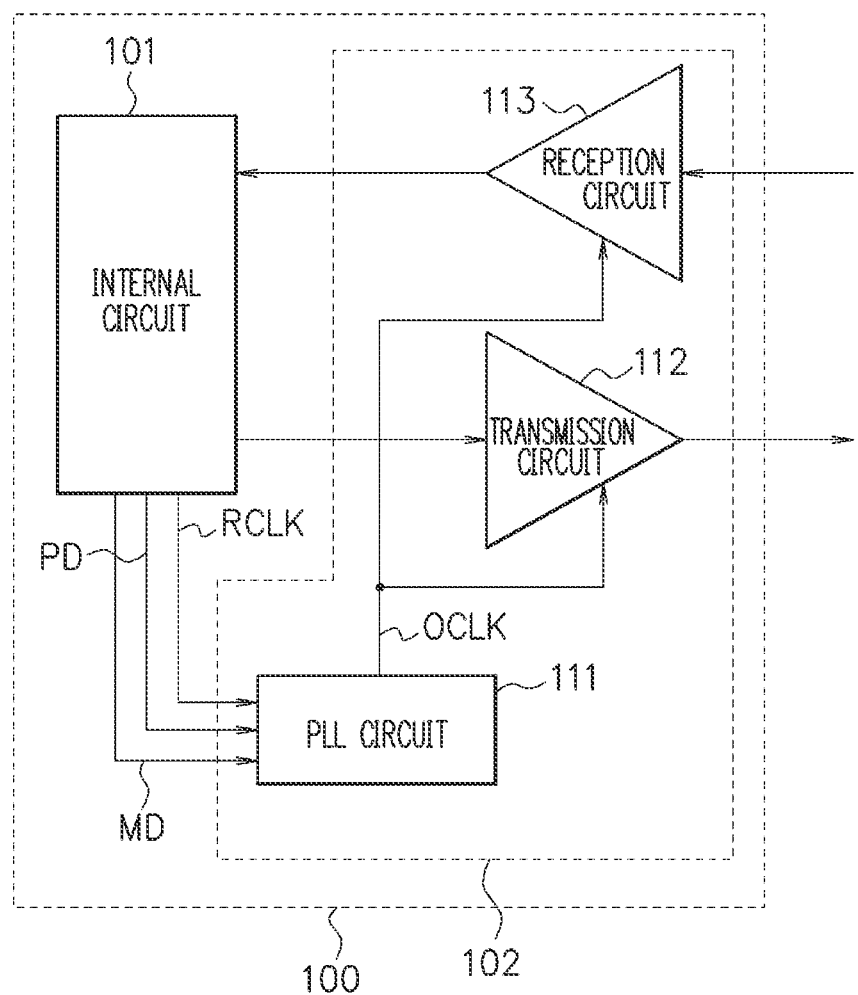

F I G. 5
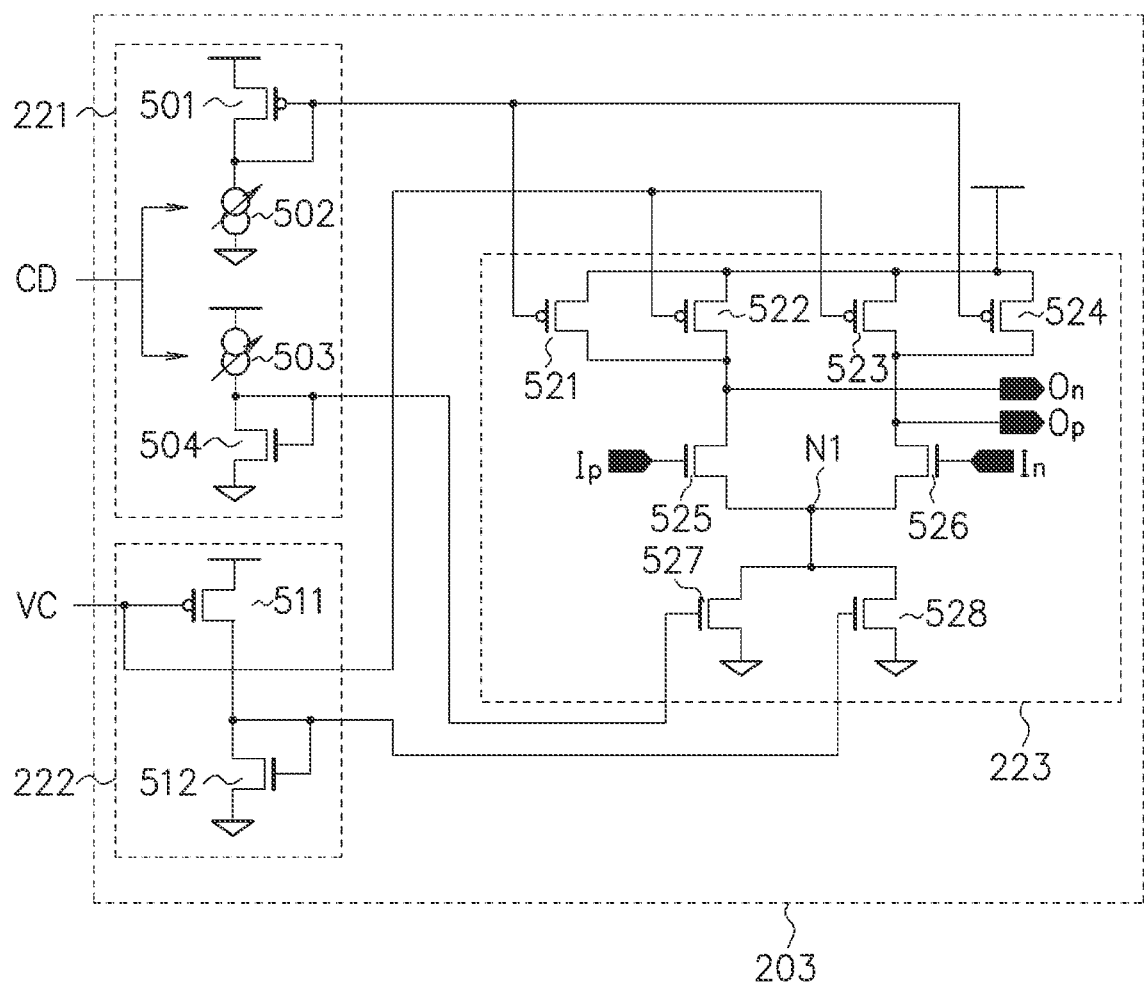

PHASE SYNCHRONIZATION CIRCUIT, TRANSMISSION AND RECEPTION CIRCUIT, AND SEMICONDUCTOR INTEGRATED CIRCUIT

CROSS-REFERENCE TO RELATED APPLICATION

This application is a continuation application of International Application PCT/JP2020/006853 filed on Feb. 20, 2020, and designated the U.S., the entire contents of which are incorporated herein by reference.

FIELD

The embodiments discussed herein are directed to a phase synchronization circuit, a transmission and reception circuit, and a semiconductor integrated circuit.

BACKGROUND

Patent Document 1 discloses a voltage controlled oscillator including a plurality of inverted differential amplifiers. A plurality of the inverted differential amplifiers are connected in series and add a current corresponding to a constant voltage for providing an offset frequency and a current corresponding to a control voltage for controlling an oscillation frequency together to oscillate at a frequency corresponding to the added current.

Patent Document 2 discloses a VCO circuit including a ring oscillator, a control current generating unit, and a constant current generating unit. The ring oscillator has an odd number of inverters connected a ring shape. The control current generating unit converts an input control voltage into a control current to supply the control current to the ring oscillator as a power supply current. The constant current generating unit generates a constant current to supply the generated constant current to the ring oscillator as a power supply current superimposed on the control current.

Patent Document 3 discloses a DLL circuit including: a delay circuit that generates a delay clock; a phase comparator circuit that outputs a phase-difference signal between the delay clock and an input clock; and a charge pump circuit that outputs a phase-difference voltage corresponding to the phase-difference signal. A low-pass filter circuit removes a high-frequency component of the output of the charge pump circuit. A delay control circuit includes a first voltage-current converting circuit that converts an output voltage of the low-pass filter circuit into a current and a second voltage-current converting circuit that converts a reference voltage into a current. An arithmetic circuit subtracts a reference current output from the second voltage-current converting circuit from a phase difference current output from the first voltage-current converting circuit, and outputs a current obtained by adding an offset current to the current resulting from, this subtraction. A current-voltage converting circuit converts the current output from the arithmetic circuit into a voltage and outputs a control voltage made of this voltage to the delay circuit.

Patent Document 4 discloses a Phase Lock Loop (PLL) circuit including a phase detector, a loop filter, and a voltage controlled oscillator. The phase detector generates a control signal representing a frequency difference between a PLL input signal and an output signal. The loop filter generates first and second voltage signals in response to the control signal. The voltage controlled oscillator includes a dynamic voltage gain control circuit. The voltage controlled oscillator modifies the frequency of an output signal in response to the first and second voltage signals. The dynamic voltage gain control circuit supplies an offset signal in response to a voltage amplitude of the first voltage signal.

[Patent Document 1] Japanese Laid-open Patent. Publication No. 2010-273386

[Patent Document 2] Japanese Laid-open Patent Publication No. 2012-191275

[Patent Document 3] Japanese Laid-open Patent Publication No. 2010-239483

[Patent Document 4] U.S. Pat. No. 7,786,771

The voltage controlled oscillator adds a current (variable current) corresponding to the control voltage and an offset current (fixed current) together, and oscillates at a frequency corresponding to the added current. However, the offset current fluctuates due to manufacturing or use conditions, causing a problem that the oscillation frequency fluctuates due to the fluctuations in the offset current.

SUMMARY

A phase synchronization circuit includes: an oscillation circuit including a variable current generation circuit unit configured to generate a variable current of a current amount corresponding to a control voltage and a fixed current generation circuit unit configured to generate a fixed current of a current amount corresponding to a correction code, the oscillation circuit being configured to generate an output clock signal having a frequency corresponding to the total current amount of the variable current and the fixed current; a feedback circuit configured to generate a feedback clock signal based on the output clock signal; a control voltage generation circuit configured to generate the control voltage to make a frequency of the output clock signal become a desired frequency based on the feedback clock signal and a reference clock signal in a normal operation mode; and a correction code generation circuit configured to generate the correction code based on the feedback clock signal and the reference clock signal in a calibration mode, in which in the calibration mode, the control voltage generation circuit outputs a fixed one of the control voltage and the correction code generation circuit adjusts the correction code to establish a desired relationship between a frequency of the feedback clock signal and a frequency of the reference clock signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a block diagram illustrating a configuration example of a semiconductor integrated circuit according to this embodiment;

FIG. 5 is a circuit diagram illustrating a configuration example of a voltage controlled oscillator;

DESCRIPTION OF EMBODIMENTS

Figure 2:
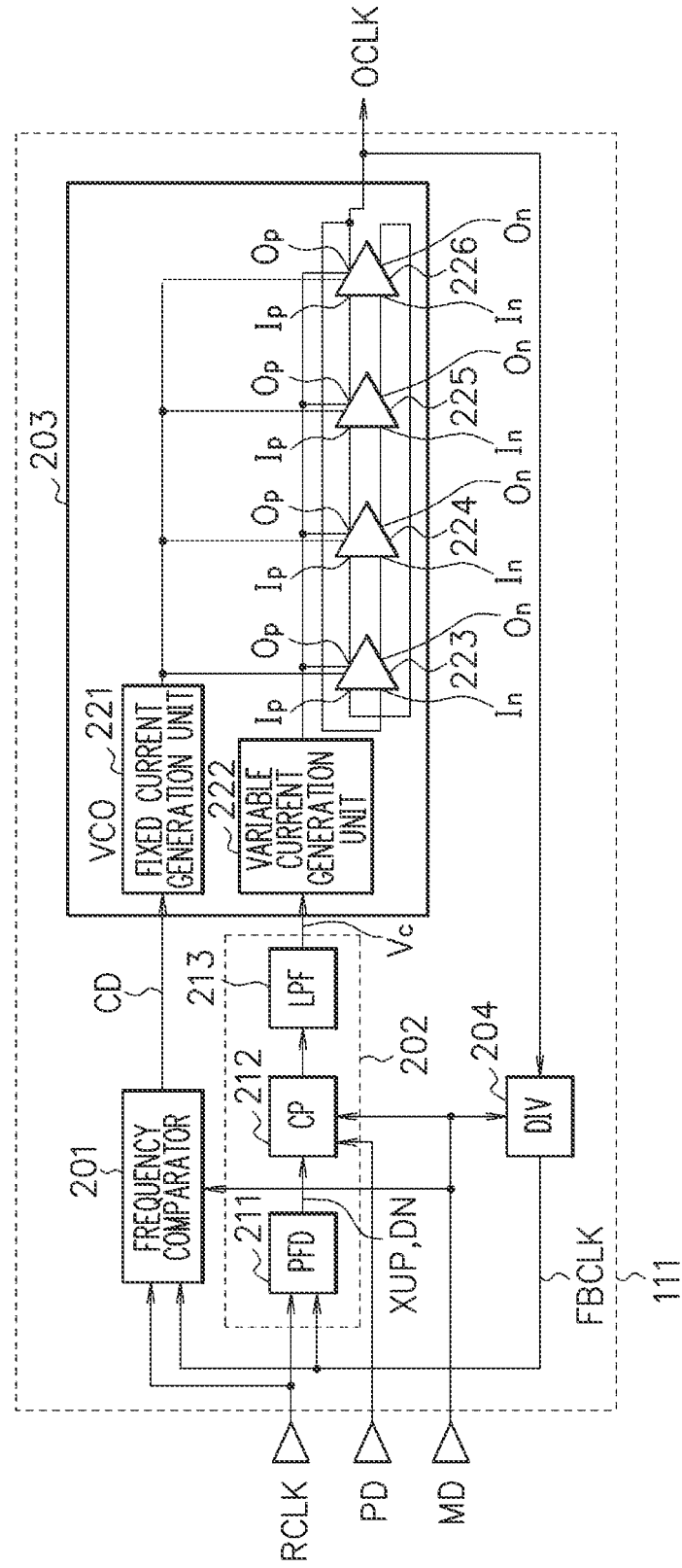
FIG. 2 is a diagram illustrating a configuration example of a PLL circuit.

FIG. 1 is a block diagram illustrating a configuration example of a semiconductor integrated circuit 100 according to this embodiment. The semiconductor integrated circuit 100 includes an internal circuit 101 and a transmission and reception circuit 102. The transmission and reception circuit 102 includes a phase locked loop circuit (PLL circuit) 111, a transmission circuit 112, and a reception circuit 113.

The internal circuit 101 transmits transmission data to the transmission circuit 112, receives reception data from the reception circuit 113, and outputs a mode signal MD, a power-down signal PD, and a reference clock signal RCLK to the PLL circuit 111. The mode signal MD is 1 in a calibration mode, and is 0 in a normal operation mode.

The PLL circuit 111 is a phase synchronization circuit, and receives the mode signal. MD, the power-down signal PD, and the reference clock signal RCLK and generates an output clock signal OCLK. The PLL circuit 111 can generate a high-precision output clock signal OCLK. The transmission circuit 112 transmits a transmission signal using the output clock signal OCLK based on the above-described transmission data. The reception circuit 113 receives a reception signal using the output clock signal OCLK and outputs the reception data to the internal circuit 101. The output clock signal OCLK is a single-ended signal or differential signal.

With speeding up of data transmission in the transmission circuit 112 and data reception in the reception circuit 113, the output clock signal OCLK generated by the PLL circuit 111 needs to achieve both high frequency and low jitter.

FIG. 2 is a diagram illustrating a configuration example of the PLL circuit 111 in FIG. 1. The Pit circuit 111 receives the reference clock signal RCLK, the power-down signal PD, and the mode signal MD and outputs the output clock signal OCLK.

The PLL circuit 111 includes a frequency comparator 201, a control voltage generation circuit 202, a voltage controlled oscillator (VCO) 203, and a frequency divider 204. The control voltage generation circuit 202 includes a phase frequency detector (PFD) 211, a charge pump circuit 212, and a loop filter (LPF) 213. The voltage controlled oscillator 203 is an oscillation circuit, and includes a fixed current generation unit 221, a variable current generation unit 222, and a plurality of buffers 223 to 226.

The fixed current generation unit 221 is a circuit which generates a fixed current of the amount of current corresponding to a correction code and controls the buffers 223 to 226 so as to make the current corresponding to the fixed current flow to each of the buffers 223 to 226.

The variable current generation unit 222 is a circuit which generates a variable current of the amount of current corresponding to a control voltage to and controls the buffers 223 to 226 so as to make the current corresponding to the variable current flow to each of the buffers 223 to 226.

The buffers 223 to 226 each include input terminals Ip and In for the differential signal and output terminals Op and On for the differential signal. The output terminals Op and On of the first-stage buffer 223 are connected to the input terminals Ip and In of the next-stage buffer 224, respectively. The output terminals Op and On of the buffer 224 are connected to the input terminals Ip and In of the next-stage buffer 225, respectively. The output terminals Op and On of the buffer 225 are connected to the input terminals Ip and In of the final-stage buffer 226, respectively. The output terminals Op and On of the final-stage buffer 226 are connected to the input terminals In and Ip of the first-stage buffer 223, respectively.

Figure 4:
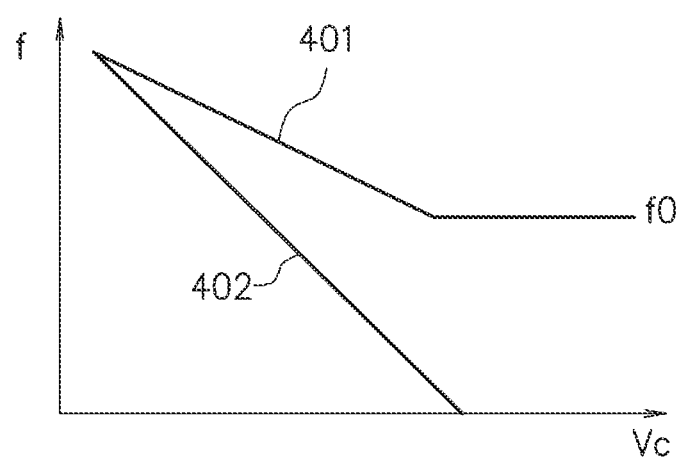
FIG. 4 is a graph illustrating the relationship between a control voltage and the frequency of the output clock signal.

The buffers 223 to 226 generate differential output clock signals OCLK having a frequency corresponding to the total current amount of the variable current generated by the variable current generation unit. 222 and the fixed current generated by the fixed current generation unit 221. As illustrated in FIG. 4, as the control voltage Vc is lower, the variable current generated by the variable current generation unit 222 becomes larger, the total current amount of the variable current and the fixed current increases, and the frequency of the output clock signal. OCLK becomes higher.

The frequency divider 204 is a feedback circuit and generates a feedback clock signal FBCLK based on the single-ended output clock signal OCLK. Specifically, when the mode signal MD is 0 and the mode is the normal operation mode, the frequency divider 204 generates and outputs the feedback clock signal FBCLK by dividing the output clock signal OCLK by a first frequency division ratio. Further, when the mode signal MD is 1 and the mode is the calibration mode, the frequency divider 204 generates and outputs the feedback clock signal FBCLK by dividing the output clock signal OCLK by a second frequency division ratio different from the first frequency division ratio. For example, the frequency divider 204 includes two frequency dividers, including a frequency divider with the first frequency division ratio and a frequency divider with the second frequency division ratio, and can be fabricated by being configured to select one of those two frequency dividers according to the mode signal MD.

The control voltage generation circuit 202 generates the control voltage Vc to make the frequency of the output clock signal OCLK become a desired frequency based on the feedback clock signal FBCLK and the reference clock signal RCLK when the mode signal MD is 0 and the mode is the normal operation mode, Specifically, for example, the control voltage generation circuit 202, in the normal operation mode, adjusts the control voltage Vc to make the difference between the phase of the feedback clock signal FBCLK and the phase of the reference clock signal RCLK small. Further, the control voltage generation circuit 202 stops based on the power-down signal PD.

Further, the control voltage generation circuit 202 outputs a fixed control voltage Vc when the mode signal MD is 1 and the mode is the calibration mode.

The phase frequency detector 211 compares the phase of the feedback clock signal FBCLK with the phase of the reference clock signal RCLK. In the case where the phase of the feedback clock signal FBCLK is delayed from the phase of the reference clock signal RCLK, the phase frequency detector 211 outputs a high-level pulse down signal DN to the charge pump circuit 212 in FIG. 9 in order to increase the frequencies of the output clock signal OCLK and the feedback clock signal FBCLK. Further, in the case where the phase of the feedback clock signal FBCLK leads the phase of the reference clock signal RCLK, the phase frequency detector 211 outputs a low-level pulse up signal XUP to the charge pump circuit 212 in FIG. 9 in order to lower the frequencies of the output clock signal OCLK and the feedback clock s signal FPCLK.

In the case where the mode signal MD is 0 (the normal operation mode) and the power-down signal PD is 0, the charge pump circuit 212 reduces the control voltage Vc when receiving the high-level pulse down signal DN, and the charge pump circuit 212 increases the control voltage Vu when receiving the low-level pulse up signal XUP.

Further, the charge pump circuit 212 outputs a fixed control voltage Vc when the mode signal MD is 1 (the calibration mode) and the power-down signal PD is 0. Further, the charge pump circuit 212 stops when the power-down signal PD is 1.

The loop filter 213 outputs the control voltage Vc to the variable current generation unit 222. At this time, the loop filter 213 moderates the fluctuations in the control voltage Vc in order to suppress extreme frequency fluctuations. The loop filter 213 is, for example, a low-pass filter that reduces the high-frequency component of the control voltage Vc.

The frequency comparator 201 is a correction code generation circuit, and generates a correction code CD based on the feedback clock signal FBCLK and the reference clock signal RCLK when the mode signal MD is 1 (the calibration mode). When the mode signal MD is 1 (the calibration mode), the frequency comparator 201 adjusts the correction code CD to establish a desired relationship between the frequency of the feedback clock signal FBCLK and the frequency of the reference clock signal RCLK. Specifically, when the mode signal MD is 1 (the calibration mode), for example, the frequency comparator 201 adjusts the correction code CD to make the difference between the frequency of the feedback clock signal FBCLK and the frequency of the reference clock signal RCLK small. When the mode signal MD is 1 (the calibration mode), for example, the frequency comparator 201 holds the correction code CD when the difference between the frequency of the feedback clock signal. FBCLK and the frequency of the reference clock signal RCLK is equal to or smaller than a desired minimum value. Further, when the mode signal MD is 0 (the normal operation mode), the frequency comparator 201 outputs the above-described holding correction code CD to the fixed current generation unit 221.

Figure 3:
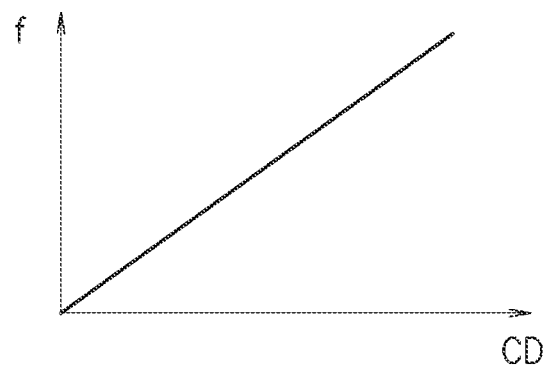
FIG. 3 is a graph illustrating the relationship between a correction code and a frequency of an output clock signal.

FIG. 3 is a graph illustrating the relationship between the correction code CD and a frequency f of the output clock signal OCLK. The fixed current generation unit 221 increases the current to generate and increases the frequency of the output clock signal OCLK as the correction code CD is larger. The frequency f of the output clock signal OCLK increases monotonically with respect to the correction code CD. Incidentally, the frequency f of the output clock signal OCLK may be designed to monotonically decrease with respect to the correction code CD.

FIG. 4 is a graph illustrating the relationship between the control voltage Vc and the frequency f of the output clock signal OCLK in the case where the mode signal MD is 0 (the normal operation mode). A frequency characteristic 401 is a frequency characteristic of the PLL circuit 111 in FIG. 2. A frequency characteristic 402 is a frequency characteristic when the frequency comparator 201 and the fixed current generation unit 221 are removed from the PLL circuit 111 in FIG. 2 and the maximum value of an oscillation frequency is adjusted to be the same as that of the circuit before removal.

As for the frequency characteristic 402, when the control voltage Vc is higher than a predetermined voltage, the frequency f of the output clock signal OCLK becomes a base frequency f0. The base frequency f0 is determined by the fixed current generated by the fixed current generation unit 221 according to the correction code CD. Further, the frequency divider 204 can divide the output clock signal OCLK by different frequency division ratios in the normal operation mode and the calibration mode. The frequency divider 204 can control the base frequency f0 by the frequency division ratio in the calibration mode.

Further, the frequency characteristic 401 has a smaller slope of the frequency f of the output clock signal OCLK relative to the control voltage Vc than the frequency characteristic 402. This slope is determined by the ratio of the fixed current generated by the fixed current generation unit 221 to the variable current generated by the variable current generation unit 222.

The frequency characteristic 402 has a large slope, and thus, the fluctuations in the frequency f of the output clock signal OCLK caused by the fluctuations in the control voltage Vc become large and the jitter of the output clock signal OCLK increases.

In contrast to this, the frequency characteristic 401 has a small slope, and thus, the fluctuations in the frequency f of the output clock signal OCLK caused by the fluctuations in the control voltage Vc become small and the jitter of the output clock signal OCLK can be reduced. The PLL circuit 111 can generate a high frequency output clock signal OCLK while keeping the slope of the frequency characteristic 401 small.

However, the base frequency f0 fluctuates due to manufacturing or use conditions, and thus, it is difficult to stabilize the frequency characteristic 401. Thus, the frequency comparator 201 is provided in the PLL circuit 111, to thereby suppress the fact that the fixed current generated by the fixed current generation unit 221 fluctuates due to manufacturing or use conditions, to cause the base frequency f0 to fluctuate due to manufacturing or use conditions. As a result, the PLL circuit 111 can reduce the fluctuations in the base frequency f0 and obtain a stable frequency characteristic 401.

FIG. 5 is a circuit diagram illustrating a configuration example of the voltage controlled oscillator 203 in FIG. 2. FIG. 5 illustrates only the configuration of the buffer 223 out of the buffers 223 to 226, but the buffers 224 to 226 also have the same configuration as that of the buffer 223.

The voltage controlled oscillator 203 includes the fixed current generation unit 221, the variable current generation unit 222, and the buffers 223 to 226. The fixed current generation unit 221 includes a p-channel field effect transistor 501, current sources 502, 503, and an n-channel field effect transistor 504.

The p-channel field effect transistor 501 has a source thereof connected to a power supply potential node and has a gate thereof connected to a drain thereof. The current source 502 is connected between the drain of the p-channel field effect transistor 501 and a reference potential node and controls the current to flow through the g-channel field effect transistor 501 according to the correction code CD. The reference potential node is a ground potential node, for example. The gate of the n-channel field effect transistor 501 is connected to gates of p-channel field effect transistors 521 and 524 to form a current mirror.

The n-channel field effect transistor 504 has a source thereof connected to the reference potential node and has a gate thereof connected to a drain thereof. The current source 503 is connected between the drain of the n-channel field effect transistor 504 and the power supply potential node and controls the current to flow through the n-channel field effect transistor 504 according to the correction code CD. The gate of the n-channel field effect transistor 504 is connected to an n-channel field effect transistor 527 to form a current mirror.

The fixed current generation unit 221 applies a fixed current of the amount of current corresponding to the correction code CD to the p-channel field effect transistor 501 and the n-channel field effect transistor 504.

The variable current generation unit 222 includes a p-channel field effect transistor 511 and an n-channel field effect transistor 512. The p-channel field effect transistor 511 has a source thereof connected to the power supply potential node, has a gate thereof connected to a node of the control voltage Vc, and has a drain thereof connected to a drain of the n-channel field effect transistor 512. The n-channel field effect transistor 512 has a gate thereof connected to the drain thereof and has a source thereof connected to the reference potential node. As the control voltage Vc is lower, the p-channel field effect transistor 511 applies a larger current to the p-channel field effect transistor 511 and the n-channel field effect transistor 512.

The gate of the p-channel field effect transistor 511 is connected to gates of p-channel field effect transistors 522 and 523 to form a current mirror. The gate of the n-channel field effect transistor 512 is connected to a gate of an n-channel field effect transistor 528 to form a current mirror.

The variable current generation unit 222 applies a variable current of the amount of current corresponding to the control voltage Vc to the n-channel field effect transistor 512.

The buffer 223 includes the p-channel field effect transistors 521 to 524 and the n-channel field effect transistors 525 to 528. The p-channel field effect transistor 521 has a source thereof connected to the power supply potential node, has the gate thereof connected to the gate of the p-channel field effect transistor 501, and has a drain thereof connected to the output terminal On. The p-channel field effect transistor 522 has a source thereof connected to the power supply potential node, has the gate thereof connected to the gate of the p-channel field effect transistor 511, and has a drain thereof connected to the output terminal On. The p-channel field effect transistor 523 has a source thereof connected to the power supply potential node, has the gate thereof connected to the gate of the p-channel field effect transistor 511, and has a drain thereof connected to the output terminal Op. The p-channel field effect transistor 524 has a source thereof connected to the power supply potential node, has the gate thereof connected to the gate of the p-channel field effect transistor 501, and has a drain thereof connected to the output terminal Op.

The same current as or current proportional to the current flowing through the p-channel field effect transistor 501 flows through the p-channel field effect transistors 521 and 524. The same current as or current proportional to the current flowing through the p-channel field effect transistor 511 flows through the p-channel field effect transistors 522 and 523.

The n-channel field effect transistor 525 has a drain thereof connected to the output terminal On, has a gate thereof connected to the input terminal Ip, and has a source thereof connected to a node N1. The n-channel field effect transistor 526 has a drain thereof connected to the output terminal Op, has a gate thereof connected to the input terminal In, and has a source thereof connected to the node N1. The n-channel field effect transistors 525 and 526 form a differential pair.

The n-channel field effect transistor 527 has a drain thereof connected to the node N1, has a gate thereof connected to the gate of the n-channel field effect transistor 504, and has a source thereof connected to the reference potential node. The n-channel field effect transistor 528 has a drain thereof connected to the node N1, has the gate thereof connected to the gate of the n-channel field effect transistor 512, and has a source thereof connected to the reference potential node.

The same current as or current proportional to the current flowing through the n-channel field effect transistor 504 flows through the n-channel field effect transistor 527. The same current as or current proportional to the current flowing through the n-channel field effect transistor 512 flows through the n-channel field effect transistor 528.

The buffers 223 to 226 receive differential signals at the input terminals Ip and In, and output the differential signals from the output terminals Op and On respectively. The buffers 223 to 226 generate the output clock signals OCLK having a frequency corresponding to the total current amount of the variable current flowing through the variable current generation unit 222 and the fixed current flowing through the fixed current generation unit 221. As the total current amount is larger, the frequency of the output clock signal OCLK becomes higher.

Figure 6:
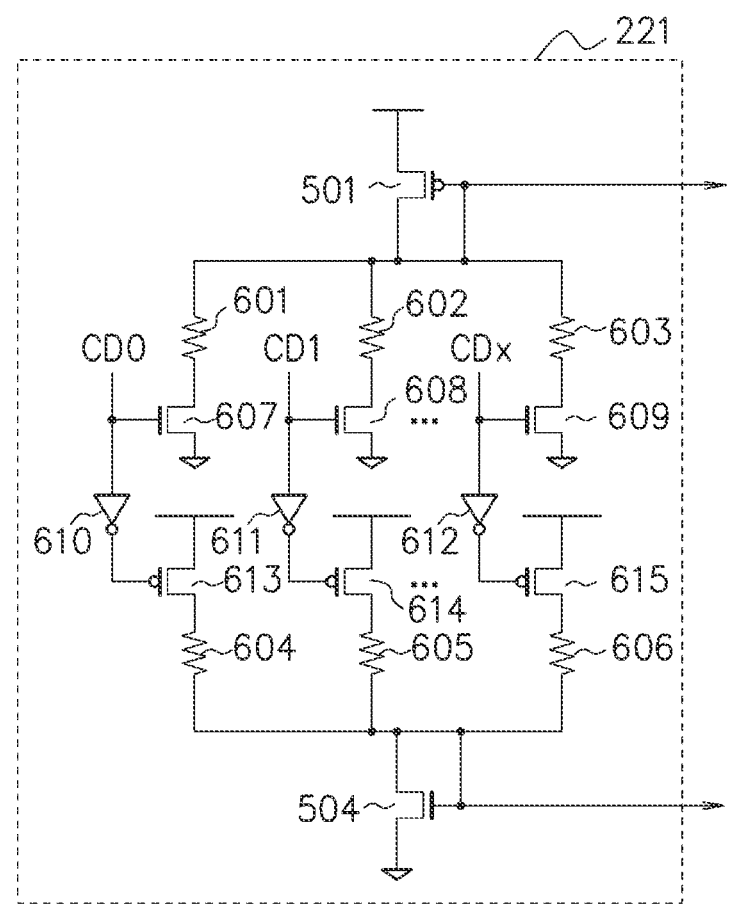
FIG. 6 is a circuit diagram illustrating a configuration example of a fixed current generation unit.

FIG. 6 is a circuit diagram illustrating a configuration example of the fixed current generation unit 221 in FIG. 5. The fixed current generation unit 221 includes resistors 601 to 606, The n-channel field effect transistor 504 and n-channel field effect transistors 607 to 609, inverters 610 to 612, and the p-channel field effect transistor 501 and p-channel field effect transistors 613 to 615. The correction code CD includes correction codes CD0 to CDx.

The p-channel field effect transistor 501 has the source thereof connected to the power supply potential node, has the gate thereof connected to the gates of the p-channel field effect transistors 521 and 524 in FIG. 5, and has the drain thereof connected to the gate thereof.

The resistor 601 is connected between the drain of the p-channel field effect transistor 501 and a drain of the n-channel field effect transistor 607. The resistor 602 is connected between the drain of the p-channel field effect transistor 501 and a drain of the n-channel field effect transistor 608. The resistor 603 is connected between the drain of the p-channel field effect transistor 501 and a drain of the n-channel field effect transistor 609.

The n-channel field effect transistor 607 has a gate thereof connected to a node of the correction code CD0 and has a source thereof connected to the reference potential node. The n-channel field effect transistor 608 has a gate thereof connected to a node of the correction code CD1 and has a source thereof connected to the reference potential node. The n-channel field effect transistor 609 has a gate thereof connected to a node of the correction code CDx and has a source thereof connected to the reference potential node.

The inverter 610 outputs a logically inverted signal of the correction code CD0 to a gate of the p-channel field effect transistor 613. The inverter 611 outputs a logically inverted signal of the correction code CD1 to a gate of the p-channel field effect transistor 614. The inverter 612 outputs a logically inverted signal of the correction code CDx to a gate of the p-channel field effect transistor 615.

Sources of the p-channel field effect transistors 613 to 615 are connected to the power supply potential node. The resistor 604 is connected between a drain of the p-channel field effect transistor 613 and the drain of the n-channel field effect transistor 504. The resistor 605 is connected between a drain of the p-channel field effect transistor 614 and the drain of the n-channel field effect transistor 504. The resistor 606 is connected between a drain of the p-channel field effect transistor 615 and the drain of the n-channel field effect transistor 504.

The n-channel field effect transistor 504 has the gate thereof connected to the drain thereof and has the source thereof connected to the reference potential node. Further, the gate of the n-channel field effect transistor 504 is connected to the gate of the n-channel field effect transistor 527 in FIG. 5.

Figure 7:
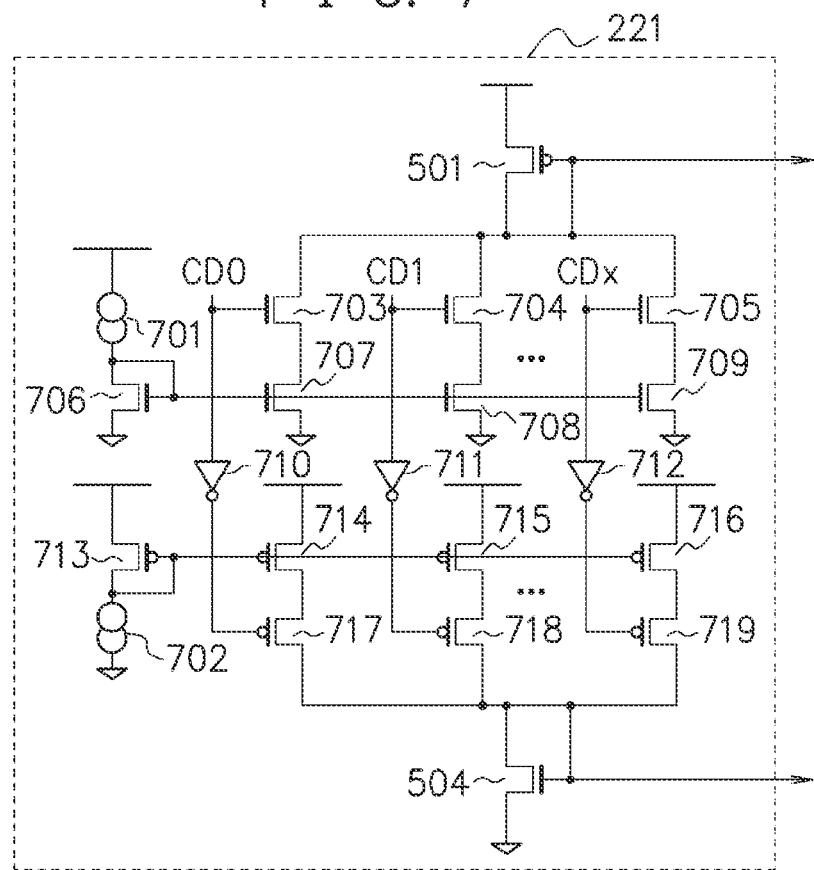
FIG. 7 is a circuit diagram illustrating another configuration example of the fixed current generation unit.

FIG. 7 is a circuit diagram illustrating another configuration example of the fixed current generation unit 221 in FIG. 5. The fixed current generation unit 221 includes current sources 701, 702, the n-channel field effect transistor 504 and n-channel field effect transistors 703 to 709, inverters 710 to 712, and the p-channel field effect transistor 501 and p-channel field effect transistors 713 to 719. The correction code CD includes the correction codes CD0 to CDx.

The p-channel field effect transistor 501 has the source thereof connected to the power supply potential node, has the gate thereof connected to the gates of the p-channel field effect transistors 521 and 524 in FIG. 5, and has the drain thereof connected to the gate thereof.

The current source 701 is connected between the power supply potential node and a drain of the n-channel field effect transistor 706. The n-channel field effect transistor 706 has a gate thereof connected to the drain thereof and has a source thereof connected to the reference potential node.

The n-channel field effect transistor 703 has a drain thereof connected to the drain of the p-channel field effect transistor 501, has a gate thereof connected to the node of the correction code CD0, and has a source thereof connected to a drain of the n-channel field effect transistor 707. The n-channel field effect transistor 707 has a gate thereof connected to the gate of the n-channel field effect transistor 706 and has a source thereof connected to the reference potential node.

The n-channel field effect transistor 704 has a drain thereof connected to the drain of the p-channel field effect transistor 501, has a gate thereof connected to the node of the correction code CD1 and has a source thereof connected to a drain of the n-channel field effect transistor 708. The n-channel field effect transistor 708 has a gate thereof connected to the gate of the n-channel field effect transistor 706 and has a source thereof connected to the reference potential node.

The n-channel field effect transistor 705 has a drain thereof connected to the drain of the p-channel field effect transistor 501, has a gate thereof connected to the node of the correction code CDx, and has a source thereof connected to a drain of the channel field effect transistor 709. The n-channel field effect transistor 709 has a gate thereof connected to the gate of the n-channel field effect transistor 706 and has a source thereof connected to the reference potential node.

The p-channel field effect transistor 713 has a source thereof connected to the power supply potential node and has a gate thereof connected to a drain thereof. The current source 702 is connected between the drain of the p-channel field effect transistor 713 and the reference potential node.

The p-channel field effect transistor 714 has a source thereof connected to the power supply potential node, has a gate thereof connected to the gate of the p-channel field effect transistor 713, and has a drain thereof connected to a source of the p-channel field effect transistor 717. The inverter 710 outputs a logically inverted signal of the correction code CD0 to a gate of the p-channel field effect transistor 717. A drain of the p-channel field effect transistor 717 is connected to the drain of the n-channel field effect transistor 504.

The p-channel field effect transistor 715 has a source thereof connected to the power supply potential node, has a gate thereof connected to the gate of the p-channel field effect transistor 713, and has a drain thereof connected to a source of the p-channel field effect transistor 718. The inverter 711 outputs a logically inverted signal of the correction code CD1 to a gate of the p-channel field effect transistor 718. A drain of the p-channel field effect transistor 718 is connected to the drain of the n-channel field effect transistor 504.

The p-channel field effect transistor 716 has a source thereof connected to the power supply potential node, has a gate thereof connected to the gate of the p-channel field effect transistor 713, and has a drain thereof connected to a source of the p-channel field effect transistor 719. The inverter 712 outputs a logically inverted signal of the correction code CDx to a date of the p-channel field effect transistor 719. A drain of the p-channel field effect transistor 719 is connected to the drain of the n-channel field effect transistor 504.

The n-channel field effect transistor 504 has the gate thereof connected to the drain thereof and has the source thereof connected to the reference potential node. Further, the gate of the n-channel field effect transistor 504 is connected to the gate of the n-channel field effect transistor 527 in FIG. 5.

Figure 8:
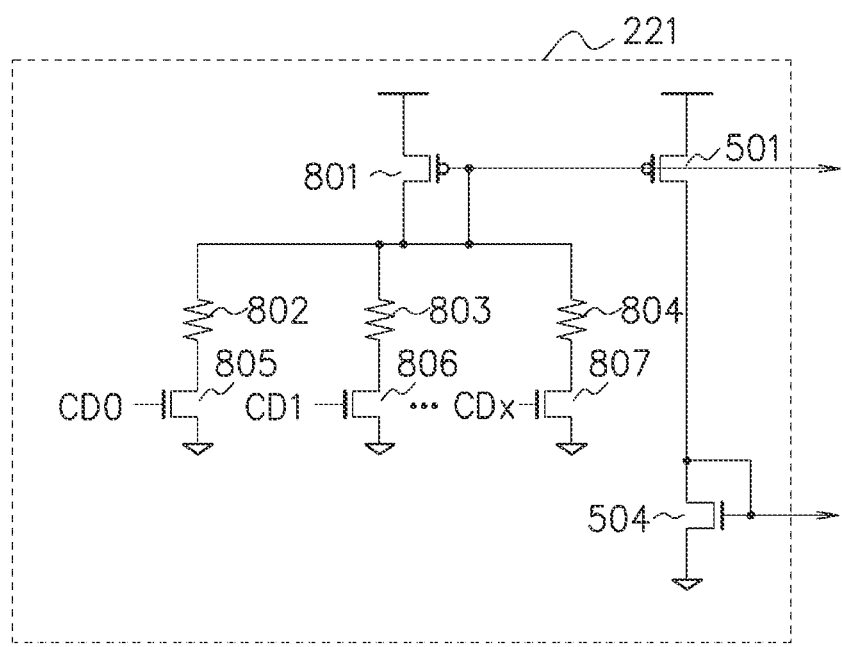
FIG. 8 is a circuit diagram illustrating still another configuration example of the fixed current generation unit.

FIG. 8 is a circuit diagram illustrating still another configuration example of the fixed current generation unit 221 in FIG. 5. The fixed current generation unit 221 includes the p-channel field effect transistor 501 and a p-channel field effect transistor 801, resistors 802 to 804, and the p-channel field effect transistor 504 and n-channel field effect transistors 805 to 807. The correction code CD includes the correction codes CDC to CDx.

The p-channel field effect transistor 501 has the source thereof connected to the power supply potential node, has the gate thereof connected to the gates of the p-channel field effect transistors 521 and 524 in FIG. 5, and has the drain thereof connected to the drain of the n-channel field effect transistor 504.

The n-channel field effect transistor 504 has the drain thereof connected to the gate thereof, has the gate thereof connected to the gate of the n-channel field effect transistor 527 in FIG. 5, and has the source thereof connected to the reference potential node.

The p-channel field effect transistor 801 has a source thereof connected to the power supply potential node, has a gate thereof connected to the gate of the p-channel field effect transistor 501, and has a drain thereof connected to the gate thereof.

The resistor 802 is connected between the drain of the p-channel field effect transistor 801 and a drain of the n-channel field effect transistor 805. The n-channel field effect transistor 805 has a gate thereof connected to the node of the correction code CD0 and has a source thereof connected to the reference potential node.

The resistor 803 is connected between the drain of the p-channel field effect transistor. 801 and a drain of the n-channel field effect transistor 806. The n-channel field effect transistor 806 has a gate thereof connected to the node of the correction code CD1 and has a source thereof connected to the reference potential node.

Figure 9:
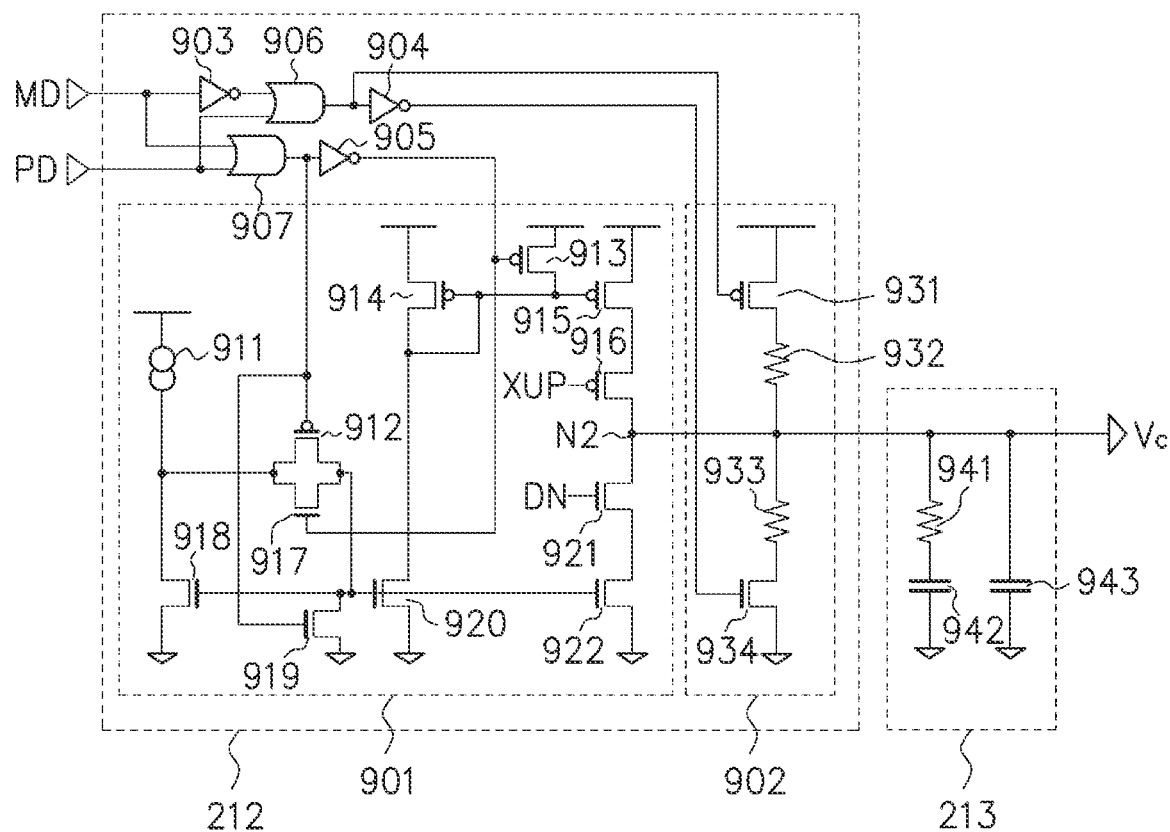
FIG. 9 is a circuit diagram illustrating configuration examples of a charge pump circuit and a loop filter.

The resistor 804 is connected between the drain of the p-channel field effect transistor 801 and a drain of the n-channel field effect transistor 807. The n-channel field effect transistor 807 has a gate thereof connected to the node of the correction code CDx and has a source thereof connected to the reference potential node, FIG. 9 is a circuit diagram illustrating configuration examples of the charge pump circuit 212 and the loop filter 213 in FIG. 2. The charge pump circuit 212 includes a charge pump unit 901, a fixed voltage generation unit 902, inverters 903 to 905, and logical sum (OR) circuits 906, 907.

The charge pump unit 901 includes a current source 911, p-channel field effect transistors 912 so 916, and n-channel field effect transistors 917 to 922. The fixed voltage generation unit 902 includes a p-channel field effect transistor 931, resistors 932, 933, and an n-channel field effect transistor 934.

The case where the mode signal MD is 1 indicates the calibration mode, and the case where it is 0 indicates the normal operation mode. The case where the power-down signal PD is 1 indicates a power-down mode, and the case where it is 0 indicates an operation mode.

The inverter 903 outputs a logically inverted signal of the mode signal MD. The logical sum circuit 906 outputs a logical sum signal of the output signal of the inverter 903 and the power-down signal PD. The inverter 904 outputs a logically inverted signal of the output signal of the logical sum circuit 906.

The logical sum circuit 907 outputs a logical sum signal of the mode signal MD and the power-down signal PD. The inverter 905 outputs a logically inverted signal the output signal of the logical sum circuit 907.

The current source 911 is connected between the power supply potential node and a drain of the n-channel field effect transistor 918. A source of the n-channel field effect transistor 918 is connected to the reference potential node. The n-channel field effect transistor 919 has a drain thereof connected to a gate of the n-channel field effect transistor 918, has a gate thereof connected to an output terminal of the logical sum circuit 907, and has a source thereof connected to the reference potential node.

The p-channel field effect transistor 912 has a source thereof connected to the drain of the n-channel field effect transistor 918, has a gate thereof connected to the output terminal of the logical sum circuit 907, and has a drain thereof connected to the gate of the n-channel field effect transistor 918. The n-channel field effect transistor 917 has a drain thereof connected to the drain of the n-channel field effect transistor 918, has a gate thereof connected to an output terminal of the inverter 905, and ham source thereof connected to the gate of the n-channel field effect transistor 918.

The p-channel field effect transistor 914 has a source thereof connected to the power supply potential node and has a gate thereof connected to a drain thereof. The n-channel field effect transistor 920 has a drain thereof connected to the drain of the p-channel field effect transistor 914, has a gate thereof connected to the to of the n-channel field effect transistor 918, and has a source thereof connected to the reference potential node.

The p-channel field effect transistor 913 has a source thereof connected to the power supply potential node, has a gate thereof connected to the output terminal of the inverter 905, and has a drain thereof connected to the gate of the p-channel field effect transistor 914.

The p-channel field effect transistor 915 has a source thereof connected to the power supply potential node, has a gate thereof connected to the gate of the p-channel field effect transistor 914, and has a drain thereof connected to a source of the p-channel field effect transistor 916. The p-channel field effect transistor 916 has a gate thereof connected to a node of the up signal XUP and has a drain thereof connected to a node N2.

The n-channel field effect transistor 921 has a drain thereof connected to the node N2, has a gate thereof connected to a node of the down signal DN, and has a source thereof connected to a drain of the n-channel field effect transistor 922. The n-channel field effect transistor 922 has a gate thereof connected to the gate of the n-channel field effect transistor 918 and has a source thereof connected to the reference potential node.

The p-channel field effect transistor 931 has a source thereof connected to the power supply potential node and has a gate thereof connected to an output terminal of the logical sum circuit 906. The resistor 932 is connected between a drain of the p-channel field effect transistor 931 and the node N2. The resistor 933 is connected between the node N2 and a drain of the n-channel field effect transistor 934. The n-channel field effect transistor 934 has a gate thereof connected to an output terminal of the inverter 904 and has a source thereof connected to the reference potential node.

The loop filter 213 includes a resistor 941 and capacitors 942 and 943, and moderates the fluctuations in the control voltage Vc of the node N2 in order- to suppress extreme frequency fluctuations. The loop filter 213 is, for example, a low-pass filter that reduces the high frequency component of the control voltage Vc of the node N2. A series connection circuit of the resistor 941 and the capacitor 942 is connected between the node N2 and the reference potential node. The capacitor 943 is connected between the node N2 and the reference potential node.

First, there is explained the case where the power-down signal PD is 1 (the power-down mode). The p-channel field effect transistor 912 and the n-channel field effect transistor 917 enter an off state. The n-channel field effect transistor 919 enters an on state and the n-channel field effect transistors 918, 920, and 922 enter an off state. The p-channel field effect transistor 913 enters an on state and the p-channel field effect transistors 914 and 915 enter an off state. The p-channel field effect transistor 931 and the n-channel field effect transistor 934 enter an off state. As a result, no current flows through the charge pump circuit 212, enabling a reduction in power consumption.

Next, there is explained the case where the power-down signal PD is 0 and the mode signal MD is 0 (the normal operation mode). The p-channel field effect transistor 912 and the n-channel field effect transistor 917 enter an on state. The n-channel field effect transistor 919 enters an off state. The p-channel field effect transistor 913 enters an off state. The p-channel field effect transistor 931 and the n-channel field effect transistor 934 enter an off state.

When the phase of the feedback clock signal FBCLK leads the phase of the reference clock signal RCLK, the up signal XUP becomes a low level pulse and the p-channel field effect transistor 916 is turned on. Then, the capacitor 943 is charged, the control voltage Vc of the node N2 increases, the frequency of the output clock signal OCLK lowers, and the phase of the feedback clock signal FBCLK is delayed.

Further, when the phase of the feedback clock signal FBCLK is delayed from the phase of the reference clock signal RCLK, the down signal DN becomes a high level pulse and the n-channel field effect transistor 921 enters an on state. Then, the capacitor 943 is discharged, the control voltage Vc of the node N2 lowers, the frequency of the output clock signal OCLK increases, and the phase of the feedback clock signal FBCLK leads.

Further, when the phase of the feedback clock signal FBCLK is the same as that of the reference clock signal RCLK, the up signal XUP becomes a high level, the down signal DN becomes a low level, and the p-channel field effect transistor 916 and the n-channel field effect transistor 921 enter an off state. The control voltage Vc of the node N2 is maintained, the frequency of the output clock signal OCLK is maintained, and the phase of the feedback clock signal FBCLK is maintained.

As described above, the charge pump circuit 212 adjusts the control voltage Vc to make the difference between the phase of the feedback clock signal FBCLK and the phase of the reference clock signal RCLK small.

Next, there is explained the case where the power-down signal PD is 0 and the mode signal MD is 1 (the calibration mode). The p-channel field effect transistor 912 and the n-channel field effect transistor 917 enter an off state. The n-channel field effect transistor 919 enters an on state and the n-channel field effect transistors 918, 920, and 992 enter an off state. The p-channel field effect transistor 913 enters an on state and the p-channel field effect transistors 914 and 915 enter an off state. The p-channel field effect transistor 931 and the n-channel field effect transistor 934 enter an on state. The fixed voltage generation unit 902 outputs a fixed control voltage Vc by dividing the voltage of the resistors 932 and 933. Incidentally, the fixed voltage generation unit 902 may output the power supply potential as a fixed control voltage Vc. The charge pump unit 901 stops with no current flowing therethrough.

Figure 10:
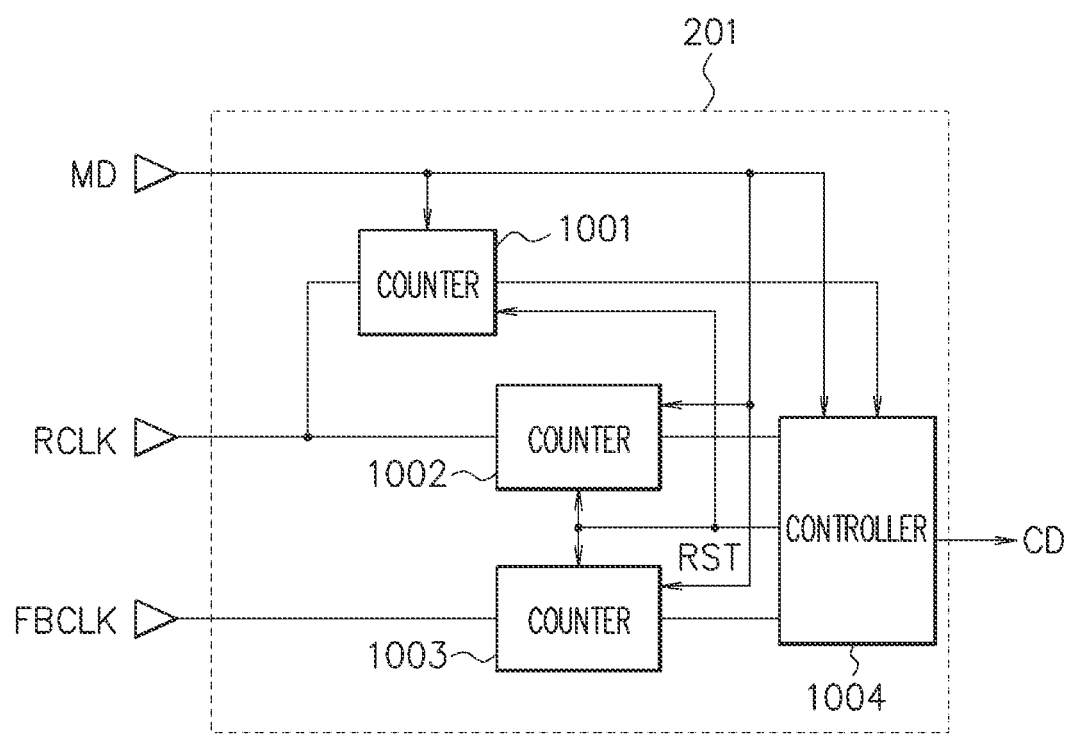
FIG. 10 is a block diagram illustrating a configuration example of a frequency comparator.

FIG. 10 is a block diagram illustrating a configuration example of the frequency comparator 201 in FIG. 2. The frequency comparator 201 includes counters 1001 to 1003 and a controller 1004. When the mode signal MD changes from 0 to 1, the counters 1001 to 1003 and the controller 1004 are reset. The counter 1001 starts counting for a measurement period. The controller 1004 outputs the correction code CD, which is an initial value. The counter 1002 starts counting the number of pulses of the reference clock signal RCLK. The counter 1003 starts counting the number of pulses of the feedback clock signal FBCLK.

The counter 1001 outputs an update signal to the controller 1004 when the measurement period elapses. Then, the controller 1004 compares the number of clocks of the reference clock signal FOLK in the measurement period counted by the counter 1002 with the number of clocks of the feedback clock signal FBCLK in the measurement period counted by the counter 1003.

Figure 11:
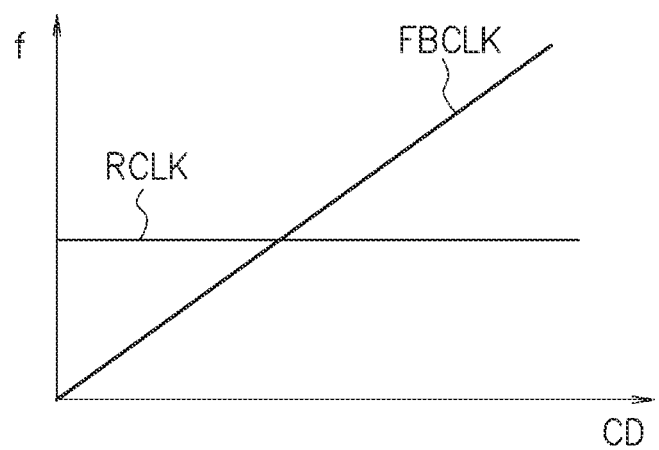
FIG. 11 is a view for explaining a method of adjusting the correction code.

There is explained the case where the fixed current generation unit 221 increases the current amount of the fixed current and increases the frequency of the output clock signal OCLK as the correction code CD is larger as illustrated in FIG. 3, for example. As illustrated in FIG. 11, in the case where the number of pulses of the feedback clock signal FBCLK in the measurement period is smaller than the number of pulses of the reference clock signal RCLK in the measurement period, the controller 1004 increases the correction code CD by one step to increase the frequencies of the output clock signal OCLK and the feedback clock signal FBCLK. Further, the case where the number of pulses of the feedback clock signal FBCLK in the measurement period is larger than the number of pulses of the reference clock signal RCLK in the measurement period, the controller 1004 reduces the correction code CD by one step and lowers the frequencies of the output clock signal OCLK and the feedback clock signal FBCLK. Further, in the case where the number of pulses of the feedback clock signal FBCLK in the measurement period is the same as the number of pulses of the reference clock signal RCLK in the measurement period, the controller 1004 holds the correction code CD and holds the frequencies of the output clock signal. OCLK and the feedback clock signal FBCLK.

Thereafter, in the case where the difference between the number of pulses of the feedback clock signal. FBCLK in the measurement period and the number of pulses of the reference clock signal RCLK in the measurement period is larger than a desired minimum value, the controller 1004 outputs a reset signal. RST to the counters 1001 to 1003 to reset the counters 1001 to 1003. Then, after the reset, the counters 1001 to 1003 and the controller 1004 perform the above-described processing repeatedly.

In the case where the difference between the number of pulses of the feedback clock signal FBCLK in the measurement period and the number of pulses of the reference clock signal RCLK in the measurement period is equal to or smaller than a desired minimum value, the controller 1004 holds the correction code CD, finishes the calibration mode, and shifts to the normal operation mode. In the normal operation mode, the controller 1004 outputs the above-described holding correction code CD to the fixed current generation unit 221.

As described above, the controller 1004 is an adjustment unit, and is a circuit which adjusts, in the calibration mode, the correction code to make the difference between the number of pulses (frequency) of the feedback clock signal FBCLK and the number of pulses (frequency) of the reference clock signal RCLK small.

Figure 12:
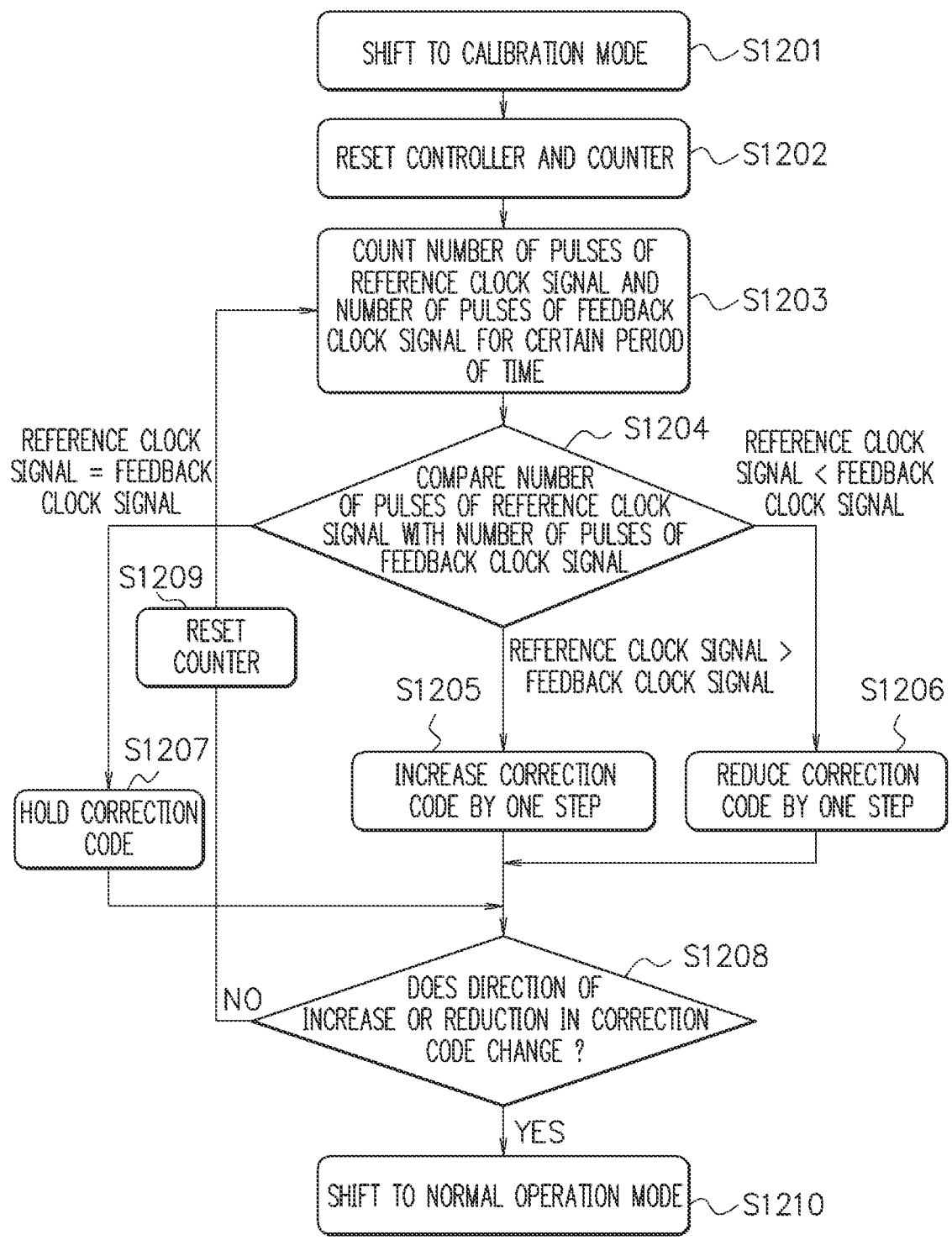
FIG. 12 is flowchart illustrating a processing method of the frequency comparator.

FIG. 12 is a flowchart illustrating a processing method of the frequency comparator 201 in FIG. 10. The frequency comparator 201 performs the processing in FIG. 12, for example, when the PLL circuit 111 is turned on or at regular time intervals.

At Step S1201, the internal circuit 101 changes the mode signal MD from 0 to 1 and shifts to the calibration mode.

Then, at Step S1202, the controller 1004 resets the counters 1001 to 1003 and the controller 1004. The controller 1004 outputs the correction code CD, which is an initial value. The counter 1001 starts counting for a certain period of time.

Then, at Step S1203, the counter 1002 counts the number of pulses of the reference clock signal RCLK in a certain period of time. The counter 1003 counts the number of pulses of the feedback clock signal FBCLK in a certain period of time.

Then, at Step S1204, the controller 1004 compares the number of pulses of the reference clock signal RCLK in a certain period of time with the number of pulses of the feedback clock signal FBCLK in a certain period of time. In the case where the number of pulses of the feedback clock signal FBCLK in a certain period of time is smaller than the number of pulses of the reference clock signal RCLK in a certain period of time, the controller 1004 proceeds to Step S1205. Further, in the case where the number of pulses of the feedback clock signal FBCLK in a certain period of time is larger than the number of pulses of the reference clock signal RCLK in a certain period of time, the controller 1004 proceeds to Step S1206. Further, in the case where the number of pulses of the feedback clock signal FBCLK in a certain period of time is the same as the number of pulses of the reference clock signal RCLK in a certain period of time, the controller 1004 proceeds to Step S1207.

At Step S1205, the controller 1004 increases the correction code CD by one step and proceeds to Step S1208.

At Step S1206, the controller 1004 reduces the correction code CD by one step and proceeds to Step S1208.

At Step S1207, the controller 1004 holds the current correction code CD and proceeds to Step S1208.

At Step S1208, in the case where there is no change in the correction code CD, the correction code CD changes from an increase in the correction code CD to a reduction in the correction code CD, or the correction code CD changes from a reduction in the correction code CD to an increase in the correction code CD, the controller 1004 proceeds to Step S1210. Further, in the case where the direction of increase or reduction in the correction code CD does not change, namely, the case where there is a change in the correction code CD, the correction code CD does not change from an increase in the correction code CD to a reduction in the correction code CD, and the correction code CD does not change from a reduction in the correction code CD to an increase in the correction code CD, the controller 1004 proceeds to Step S1209.

At Step S1209, the controller 1004 resets the counters 1001 to 1003 and returns to Step S1203 and performs the above-described processing repeatedly.

At Step S1210, the controller 1004 holds the correction code CD. The internal circuit 101 changes the mode signal MD from 0 to 1 and shifts to the normal operation mode in the normal operation mode, the controller 1004 outputs the holding correction code CD to the fixed current generation unit 221.

Next, there is explained the case where the fixed current generation unit 22.1 reduces the current amount of the fixed current and lowers the frequency of the output clock signal OCLK as the correction code CD is larger. In the case where the number of pulses of the feedback clock signal FBCLK in the measurement period is smaller than the number of pulses of the reference clock signal RCLK in the measurement period, the controller 1004 reduces the correction code CD by one step and increases the frequencies of the output clock signal OCLK and the feedback clock signal FBCLK. Further, in the case where the number of pulses of the feedback clock signal FBCLK in the measurement period is larger than the number of pulses of the reference clock signal RCLK in the measurement period, the controller 1004 increases the correction code CD by one step and lowers the frequencies of the output clock signal OCLK and the feedback clock signal FBCLK. Further, in the case where the number of pulses of the feedback clock signal FBCLK in the measurement period is the same as the number of pulses of the reference clock signal RCLK in the measurement period, the controller 1004 holds the correction code CD and holds the frequencies of the output clock signal OCLK and the feedback clock signal FBCLK.

Thereafter, in the case where the difference between the number of pulses of the feedback clock signal FBCLK in the measurement period and the number of pulses of the reference clock signal RCLK in the measurement period is larger than a desired minimum value, the controller 1004 outputs the reset signal RST to the counters 1001 to 1003 to reset the counters 1001 to 1003. Then, after the reset, the counters 1001 to 1003 and the controller 1004 perform the above-described processing repeatedly.

In the case where the difference between the number of pulses of the feedback clock signal FBCLK in the measurement period and the number of pulses of the reference clock signal RCLK in the measurement period is equal to or smaller than a desired minimum value, the controller 1004 holds the correction code CD, finishes the calibration mode, and shifts to the normal operation mode. In the normal operation mode, the controller 1004 outputs the above-described holding correction code CD to the fixed current generation unit 221.

In the case where there is no change in the correction code CD, the correction code CD changes from an increase in the correction code CD to a reduction in the correction code CD, or the correction code CD changes from a reduction in the correction code CD to an increase in the correction code CD, for example, the controller 1004 holds the correction code CD and holds the frequencies of the output clock signal OCLK and the feedback clock signal FBCLK.

As described above, the frequency comparator 201 adjusts the correction code. CD to make the difference between the frequency of the feedback clock signal FBCLK and the frequency of the reference clock signal RCLK small. The fixed current generation unit 221 generates a fixed current based on the correction code CD, thus making it possible to suppress the fluctuations in the fixed current caused by manufacturing or use conditions. The buffers 223 to 226 generate the output clock signals OCLK having a frequency corresponding to the total current amount of the variable current of the variable current generation unit 222 and the fixed current of the fixed current generation unit 221, thus making it possible to stabilize the frequency characteristic 401 in FIG. 4. The voltage controlled oscillator 203 can reduce the slope of the frequency characteristic 401 in FIG. 4 thus making it possible to reduce the jitter of the output clock signal OCLK.

Incidentally, the above-described embodiments merely illustrate one concrete example of implementing the present invention, and the technical scope of the present invention is not to be construed in a restrictive manner by the embodiment. That is, the present invention may be implemented in various forms without departing from the technical spirit or main features thereof.

By suppressing the fluctuations in the fixed current caused by manufacturing or use conditions, the output clock signal having a frequency corresponding to the total current amount of the variable current and the fixed current can be generated, while suppressing the fluctuations in the oscillation frequency caused by the fluctuations in the fixed current.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A phase synchronization circuit, comprising:
   an oscillation circuit including a variable current generation circuit unit configured to generate a variable current of a current amount corresponding to a control voltage and a fixed current generation circuit unit configured to generate a fixed current of a current amount corresponding to a correction code, the oscillation circuit being configured to generate an output clock signal having a frequency corresponding to the total current amount of the variable current and the fixed current;

a feedback circuit configured to generate a feedback clock signal based on the output clock signal;

a control voltage generation circuit configured to generate the control voltage to make a frequency of the output clock signal become a desired frequency based on the feedback clock signal and a reference clock signal in a normal operation mode; and a correction code generation circuit configured to generate the correction code based on the feedback clock signal and the reference clock signal in a calibration mode, wherein in the calibration mode, the control voltage generation circuit outputs a fixed one of the control voltage and the correction code generation circuit adjusts the correction code to establish a desired relationship between a frequency of the feedback clock signal and a frequency of the reference clock signal, and wherein the correction code generation circuit includes:

a first counter configured to count the number of pulses of the feedback clock signal;

a second counter configured to count the number of pulses of the reference clock signal; and an adjustment circuit unit configured to adjust the correction code to make the difference between the number of pulses of the feedback clock signal and the number of pulses of the reference clock signal small.

2. The phase synchronization circuit according to claim 1, wherein the feedback circuit is a frequency divider configured to generate the feedback clock signal by dividing the output clock signal.

3. The phase synchronization circuit according to claim 2, wherein the frequency divider is configured to generate the feedback clock signal by dividing the output clock signal by a first frequency division ratio in the normal operation mode, and generate the feedback clock signal by dividing the output clock signal by a second frequency division ratio that is different from the first frequency division ratio in the calibration mode.

4. The phase synchronization circuit according to claim 1, wherein the control voltage generation circuit is configured to control the control voltage to make the difference between a phase of the feedback clock signal and a phase of the reference clock signal small in the normal operation mode.

5. The phase synchronization circuit according to claim 1, wherein the control voltage generation circuit includes a loop filter that moderates fluctuations in the control voltage.

6. The phase synchronization circuit according to claim 1, wherein the correction code generation circuit is configured to adjust the correction code to make the difference between the frequency of the feedback clock signal and the frequency of the reference clock signal small in the calibration mode.

7. The phase synchronization circuit according to claim 1, wherein the fixed current generation circuit unit is configured to increase a current amount of the fixed current as the correction code is larger, and in the case where the number of pulses of the feedback clock signal is smaller than the number of pulses of the reference clock signal, the adjustment unit increases the correction code, and in the case where the number of pulses of the feedback clock signal is larger than the number of pulses of the reference clock signal, the adjustment unit reduces the correction code.

8. The phase synchronization circuit according to claim 7, wherein in the case where the correction code changes from an increase in the correction code to a reduction in the correction code, or the correction code changes from a reduction in the correction code to an increase in the correction code, the adjustment unit holds the correction code in the calibration mode, and the adjustment unit outputs the holding correction code to the fixed current generation unit in the normal operation mode.

9. The phase synchronization circuit according to claim 1, wherein the fixed current generation unit is configured to reduce a current amount of the fixed current as the correction code is larger, and in the case where the number of pulses of the feedback clock signal is smaller than the number of pulses of the reference clock signal, the adjustment unit reduces the correction code, and in the case where the number of pulses of the feedback clock signal is larger than the number of pulses of the reference clock signal, the adjustment unit increases the correction code.

10. The phase synchronization circuit according to claim 9, wherein in the case where the correction code changes from an increase in the correction code to a reduction in the correction code, or the correction code changes from a reduction in the correction code to an increase in the correction code, the adjustment unit holds the correction code in the calibration mode, and the adjustment unit outputs the holding correction code to the fixed current generation unit in the normal operation mode.

11. The phase synchronization circuit according to claim 1, wherein the oscillation circuit includes a plurality of buffers configured to generate an output clock signal having a frequency corresponding to the total current amount of the variable current and the fixed current.

12. The phase synchronization circuit according to claim 11, wherein the plurality of buffers receive and output a differential signal, respectively.

13. A transmission and reception circuit, comprising:

a phase synchronization circuit configured to generate an output clock signal;

a transmission circuit configured to transmit a transmission signal using the output clock signal; and a reception circuit configured to receive a reception signal using the output clock signal, wherein the phase synchronization circuit includes:

an oscillation circuit that includes a variable current generation circuit unit configured to generate a variable current of a current amount corresponding to a control voltage and a fixed current generation circuit unit configured to generate a fixed current of a current amount corresponding to a correction code, the oscillation circuit being configured to generate the output clock signal having a frequency corresponding to the total current amount of the variable current and the fixed current;

a feedback circuit configured to generate a feedback clock signal based on the output clock signal;

a control voltage generation circuit configured to generate the control voltage to make a frequency of the output clock signal become a desired frequency based on the feedback clock signal and a reference clock signal in a normal operation mode; and a correction code generation circuit configured to generate the correction code based on the feedback clock signal and the reference clock signal in a calibration mode, and in the calibration mode, the control voltage generation circuit outputs a fixed one of the control voltage and the correction code generation circuit adjusts the correction code to establish a desired relationship between a frequency of the feedback clock signal and a frequency of the reference clock signal, and wherein the correction code generation circuit includes:

a first counter configured to count the number of pulses of the feedback clock signal;

a second counter configured to count the number of pulses of the reference clock signal; and an adjustment circuit unit configured to adjust the correction code to make the difference between the number of pulses of the feedback clock signal and the number of pulses of the reference clock signal small.

14. The transmission and reception circuit according to claim 13, wherein the feedback circuit is a frequency divider configured to generate the feedback clock signal by dividing the output clock signal.

15. The transmission and reception circuit according to claim 14, wherein the frequency divider is configured to generate the feedback clock signal by dividing the output clock signal by a first frequency division ratio in the normal operation mode, and generate the feedback clock signal by dividing the output clock signal by a second frequency division ratio that is different from the first frequency division ratio in the calibration mode.

16. The transmission and reception circuit according to claim 13, wherein the control voltage generation circuit is configured to control the control voltage to make the difference between a phase of the feedback clock signal and a phase of the reference clock signal small in the normal operation mode.

17. The transmission and reception circuit according to claim 13, wherein the correction code generation circuit is configured to adjust the correction code to make the difference between the frequency of the feedback clock signal and the frequency of the reference clock signal small in the calibration mode.

18. A semiconductor integrated circuit, comprising:

a transmission and reception circuit; and an internal circuit configured to transmit transmission data to the transmission and reception circuit and receive reception data from the transmission and reception circuit, wherein the transmission and reception circuit includes:

a phase synchronization circuit configured to generate an output clock signal;

a transmission circuit configured to transmit a transmission signal based on the transmission data using the output clock signal; and a reception circuit configured to receive a reception signal and output the reception data to the internal circuit using the output clock signal, the phase synchronization circuit includes:

an oscillation circuit that includes a variable current generation circuit unit configured to generate a variable current of a current amount corresponding to a control voltage and a fixed current generation circuit unit configured to generate a fixed current of a current amount corresponding to a correction code, the oscillation circuit being configured to generate the output clock signal having a frequency corresponding to the total current amount of the variable current and the fixed current;

a feedback circuit configured to generate a feedback clock signal based on the output clock signal;

a control voltage generation circuit configured to generate the control voltage to make a frequency of the output clock signal become a desired frequency based on the feedback clock signal and a reference clock signal in a normal operation mode; and a correction code generation circuit configured to generate the correction code based on the feedback clock signal and the reference clock signal in a calibration mode, and in the calibration mode, the control voltage generation circuit outputs a fixed one of the control voltage and the correction code generation circuit adjusts the correction code to establish a desired relationship between a frequency of the feedback clock signal and a frequency of the reference clock signal, and wherein the correction code generation circuit includes:

a first counter configured to count the number of pulses of the feedback clock signal;

a second counter configured to count the number of pulses of the reference clock signal; and an adjustment circuit unit configured to adjust the correction code to make the difference between the number of pulses of the feedback clock signal and the number of pulses of the reference clock signal small.

* * * * *